United States Patent [19]

Gonsiorawski

[11] 4,152,824
[45] May 8, 1979

[54] MANUFACTURE OF SOLAR CELLS
[75] Inventor: Ronald Gonsiorawski, Danvers, Mass.
[73] Assignee: Mobil Tyco Solar Energy Corporation, Waltham, Mass.
[21] Appl. No.: 865,953
[22] Filed: Dec. 30, 1977
[51] Int. Cl.² .................. H01L 21/223; H01L 21/225
[52] U.S. Cl. ..................................... 29/572; 148/187; 148/1.5; 148/188; 136/89 R; 357/30
[58] Field of Search ....................... 148/187, 188, 189; 136/89 SG, 89 CC; 29/572; 357/30

[56] References Cited
U.S. PATENT DOCUMENTS

| Re. 28,610 | 11/1975 | Lindmayer | 136/89 CC |
| 3,686,036 | 8/1972 | Gareth et al. | 136/89 CC |
| 3,841,928 | 10/1974 | Takemoto et al. | 148/188 X |
| 4,029,518 | 6/1977 | Matsutani et al. | 136/89 CC |
| 4,070,689 | 1/1978 | Coleman et al. | 136/89 CC |

Primary Examiner—G. Ozaki
Attorney, Agent, or Firm—Schiller & Pandiscio

[57] ABSTRACT

The invention provides a method of producing solar cells having a composite shallow/deep junction device construction. The solar cells have grid-like contacts on their front energy-receiving sides, with each portion of each contact being coincident, i.e., aligned with, the deep junction regions while the shallow junction regions are exposed to incident radiation. The composite junction and contacts are formed by a novel method which employs conventional techniques, notably the use of doped oxide films as diffusion sources.

19 Claims, 8 Drawing Figures

MANUFACTURE OF SOLAR CELLS

This invention relates to semiconductor photovoltaic solar cells and more particularly to an improved method of manufacturing solar cells.

Semiconductor photovoltaic solar cells, notably silicon solar cells, have been made using a variety of unique concepts and techniques for forming photovoltaic functions and providing ohmic contacts. The substantial body of prior art which exists in connection with the manufacture of solar cells is exemplified by U.S. Pat. Nos. 3,686,036, 3,653,970, 3,359,137, 3,361,594, 3,502,507, 3,589,946, 3,966,499, 3,977,905 and Re 28,610, and the references cited therein. In recent years the increasing need for new sources of energy has caused persons skilled in the art to work toward the development of low cost, high performance solar cells. While reducing the cost of providing semiconductor silicon substrates and forming photoactive junctions is of primary concern, it also is appreciated that the fabrication of contacts is a significant cost, yield and performance factor. In this connection it is to be noted that in the typical solar cell the photoactive junction must be located below the solar energy-receiving surface at a depth calculated to render the device capable of responding most efficiently to the ultraviolet portion of the received energy. Thus, in a silicon solar cell the P-N junction is located between about 0.1 and about 0.5$\mu$m (microns) below the energy receiving silicon surface. Because of the shallow junction depth, care must be used in applying the semiconductor 0.5 contact to the front, i.e., energy-receiving, surface of the cell so as to avoid having the metal contact material from penetrating the cell down to the P-N junction, which would cause a short circuit and consequent loss of efficiency. An additional concern is to provide contacts which are relatively low cost, adhere well to the solar cell and are essentially ohmic in nature.

In the typical solar cell, the contact on the front energy-receiving surface is in the form of a grid consisting of a plurality of narrow finger-like sections extending at a right angle and connected to a relatively wide bus section. Prior methods of forming such contacts on solar cells usually have been subtractive in nature or have involved deposition through masks. In the typical substractive-type contact fabrication technique, a metal film is deposited over the entire front surface of the solar cell and then the desired grid pattern is formed by etching away undesired portions of the film. In the typical masking technique, a metal film is deposited by vacuum evaporation, sputtering or screening procedures employing a mask with apertures defining the desired grid pattern. Substractive processes are unsatisfactory since the etching and recovery of undesired metal tends to be expensive and may be complicated or difficult. The masking techniques are not wholly satisfactory for similar reasons since a substantial amount of metal is deposited onto the solid portions of the masks and such metal represents a total loss unless recovered.

Heretofore it has been recognized that the likelihood of damaging the P-N junction when an electrode is constructed on the front energy-receiving surface may be reduced by forming the junction so that it is relatively deep (about 3 microns) where the electrode is located and relatively shallow (about 0.5 microns) in the regions where there is no electrode of the front surface. U.S. Pat. No. 4,029,518 discloses two different techniques for producing solar cells with composite shallow/deep junctions. The same type of junction and a technique for achieving the same are disclosed by M. J. Hovel and J. M. Woodall, Method for Si and GaAs Solar Cell Diffusion, IBM Tech. Disc. Bulletin, Vol. 16, No. 7, pp 2083-2084, Dec. 1973.

One of the fabrication techniques disclosed by U.S. Pat. No. 4,029,518 suffers from the disadvantage that it requires two diffusion steps and also two different applications of a resist layer. The second technique disclosed by U.S. Pat. No. 4,029,518 is impractical since it involves junction-thinning by etching. The problem with junction thinning is that it removes the high concentration diffusant dopant from the high conductivity region, with the result that current flow across the diffused region will tend to suffer an $I^2R$ loss. The technique disclosed by Hovel and Woodall involves diffusion through an $SiO_2$ mask. It suffers from the disadvantage that the formation of the shallow/deep junction requires precise control of the thickness and diffusion-marking properties of the $SiO_2$ film.

Accordingly the primary object of this invention is to provide an improved method of making a solar cell which overcomes certain limitations of the prior art.

A more specific object is to provide a relatively low cost solar cell which features improved plated contacts.

Still another object is to provide an improved method of producing plated contacts on a solar cell.

A further object is to provide relatively low cost front contacts for solar cells by a method whereby relatively low priced metals are applied selectively rather than subtractively to appropriate surface areas by electroless plating techniques.

An additional object is to provide improved methods of making relatively low cost solar cells which have P-N junctions and contacts that are reliable and whereby the contacts can be made at relatively low cost according to one or more techniques.

These and other objects are achieved by providing an improved method of producing solar cells having a composite shallow/deep junction device construction. The solar cells each have a grid-like contact on their front energy-receiving sides and are formed with a deep junction in the regions under coincident portions of the front contacts and a shallow junction in the regions which are exposed to the incident radiation. The composite shallow/deep junction regions are formed by a diffusion process involving the use of a doped glass as a diffusion source. Other features and many of the attendant advantages of this invention are presented or made obvious by the following detailed description which is to be considered with the accompanying drawing wherein:

The present invention employs doped oxide diffusion sources and may be characterized as including a step of introducing dopant impurities into a body of silicon of selected conductivity type so as to impart opposite type conductivity thereto and provide a P-N junction with geometrically defined shallow and deep junction regions. Of importance is the fact that the deep junction regions are formed according to a predetermined front contact grid pattern to permit the formation of nickel silicides as required for good ohmic contacts without shunting of the junction by silicide penetration. The doped oxide diffusion sources are applied to a selected silicon substrate by chemical vapor deposition (C.V.D.) techniques, preferably by techniques such as are disclosed in U.S. Pat. No. 3,481,781 issued Dec. 2, 1969 to W. Kern, and disclosed by N. Goldsmith et al, The Deposition of Vitreous Silicon Dioxide Films From Silane, RCA Review, Vol. 28, Page 153, March 1967, A. W. Fisher et al, Diffusion Characteristics and Applications of Doped Silicon Dioxide Layers Deposited From Silane, RCA Review, Volume 29, p. 533, December 1968 (Fisher I), and A. W. Fisher et al, Diffusion Characteristics of Doped Silicon Dioxide Layers Deposited from Premixed Hydrides, RCA Review, Volume 29, p. 549, December 1968, (Fisher II). Further insight regarding doped oxide diffusion sources, also characterized as "solid-solid diffusion sources", is provided by D. M. Brown et al, Glass Source B Diffusion in Si and $SiO_2$, J. Electrochem. Soc., Vol. 118, No. 2, page 293 (February 1971) and G. Kambara et al, A New Technique for Low Concentration Diffusion of Boron into Silicon, Proceedings of the 8th Conference (1976 International) on Solid State Devices, page 37, Tokyo 1976, and U.S. Pat. No. 3,738,880 issued June 12, 1973 to A. Laker.

Figure 1:
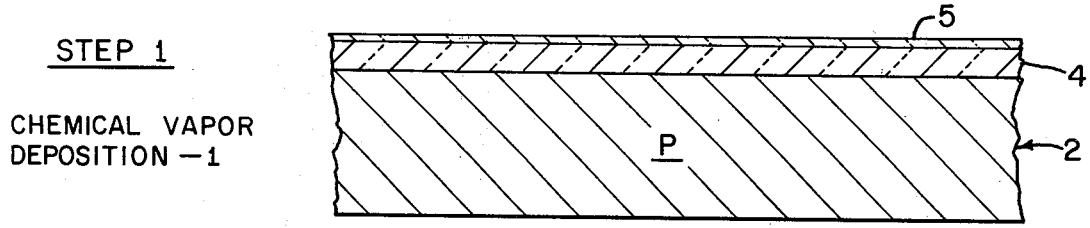
FIGS. 1–6 are schematic cross-sectional views which illustrate different steps in a preferred method of making solar cells according to this invention.

Referring now to the drawings, fabrication of solar cells according to this invention preferably begins (FIG. 1) with a silicon semiconductor substrate 2 of P-type conductivity. After cleaning as preferred or required, e.g., by successively immersing the substrate in hot organic solvents and hot chromic-sulfuric acid, followed by rinsing with HF acid as described by Fisher I supra, one side of the substrate is subjected to a chemical vapor deposition (Step I) to provide an adherent deposited $SiO_2$ layer 4 doped with a selected diffusion donor impurity appropriate for forming an N-type conductivity region in the substrate by a subsequent diffusion step as hereinafter described. An appropriate donor impurity for forming an N-type conductivity region is phosphorus, arsenic or antimony. The doped layer 4 may be formed by any of the following deposition techniques: (1) oxidation of a silane compound, e.g., silane or tetrachlorosilane, (2) coating from silicate-bearing liquids, commonly called spin-on sources, by spin-on, spray or dip coating the substrate and (3) reactive sputtering of doped silicon cathodes in oxygen. The dopant constitutent may be supplied to layer 4 during its formation or subsequently by diffusion or other suitable technique. In the preferred mode of practicing the invention the doped layer is formed by oxidation of silane in the presence of phosphine gas ($PH_3$) as the N-conductivity type dopant. Arsine gas ($AsH_3$) is a known alternative to phoshine gas and may be deemed preferable by others skilled in the art since it has a lower diffusion coefficient in silicon than phosphorus and hence offers promise of permitting an even shallower diffused active junction region with less compromise of the depth of the deep junction regions provided under the grid-like front contact.

The chemical vapor deposition reaction of Step I may be represented as follows:

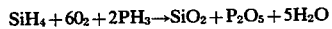

with the deposited product layer 4 being a phosphorus doped vitreous silicon dioxide (also called a phosphosilicate glass) conveniently represented as $SiO_2(P)$. This reaction may be carried out at deposition temperatures between about 275° C. and about 700° C. but preferably the reaction is carried out so that the temperature of the substrate surface on which deposition is to occur is about 400° C. with heat being applied to the substrate via its opposite surface. The deposition reaction is carried out in an open type chamber permitting the continuous feeding of substrates. The reaction is carried out by feeding silane (diluted to 5% by volume in nitrogen) and pure oxygen into the reaction chamber. Simultaneously phosphine (diluted to 1% by volume in nitrogen) is metered into the reaction chamber. Preferably the feeding of reactants is controlled so that the deposited phosphorus doped glass layer 4 has a depth growth rate of about 500-1200 angstrom units per minute and has a dopant concentration of about $1.4 \times 10^{22}$ atoms/$cm^3$. The flow of phosphine is terminated after the phosphorus doped $SiO_2$ layer has reached a thickness of about 8000Å, and thereafter the flow of silane and oxygen to the reaction chamber is maintained until about 1500-3000Å of undoped "capping" oxide has been deposited on top of the doped oxide. Then the flow of reactants is terminated to stop further oxide growth. The undoped capping oxide layer 5 is formed for several reasons noted in Fisher I supra: (1) it tends to seal the surface so that out-diffusion of dopant during the subsequent drive-in (i.e., diffusion) stop is minimized, (2) it helps prevent contamination of the doped oxide layer by materials from the walls of the diffusion furnace, and (3) photoresist layers tend to adhere better to undoped oxide than to the doped oxide, especially when phosphorus is the dopant.

Figure 2:
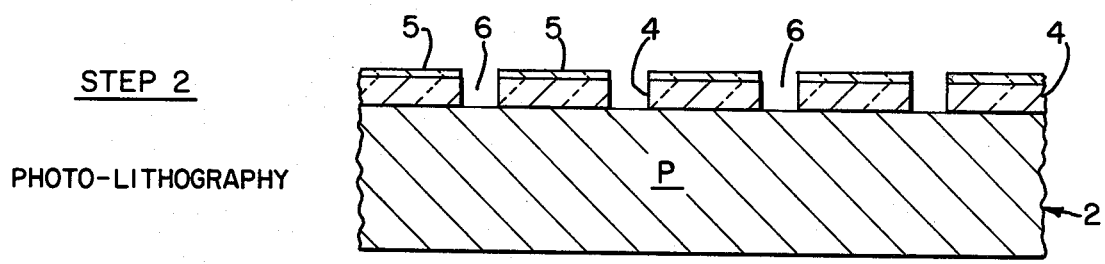

The second step (FIG. 2) is to chemically etch apertures 6 through the deposited layers 4 and 5 with the apertures arranged to form a grid pattern corresponding to the desired pattern of the front electrode which is to be formed, e.g. a pattern as shown in U.S. Pat. No. 3,686,036. The etching is accomplished through openings formed in an etch resistant coating that may be applied to the glass layer 5 in various ways, by (1) screen printing an etch resist or (2) evaporating and depositing an etch resistant metal film through suitable masks onto the glass layer 4 as a shadow image of the desired grid pattern. Preferably, however, the apertures are formed by a conventional photoetching process comprising applying a suitable negative or positive photoresist over the glass layer 5, exposing the photoresist through a suitable negative or positive mask, developing the resist to remove portions thereof corresponding to the desired electrode grid pattern, and then exposing the resist-covered layers 4 and 5 to a suitable etchant so as to removed those portions which are not protected by the remaining photoresist. Suitable positive and negative photoresists are general Aniline and Film Corporation Microline R and Hunt Chemical Corporation Waycoat R IC-28 photoresists. Other suitable photoresists known to persons skilled also may be used. The etching is accomplished preferably by exposing the layer 4 to buffered 10 $NH_4F$(40%):1 HF acid at a temperature between about 25° C. and about 40° C. Full removal of the exposed glass is manifested by a discrete difference in color between the newly exposed upper surface of the substrate and the removed portions of layers 4 and 5. After the apertures 6 have been formed, the remaining etch resist is removed by a suitable solvent for the particular photoresist used.

Figure 3:
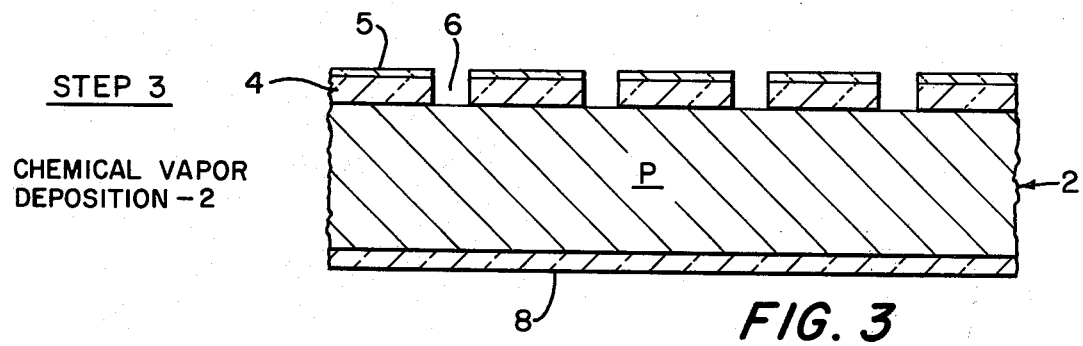

The third step (FIG. 3) is to deposit on the back side of the substrate a layer 8 which also is a doped silicate glass diffusion source. In this case the silicon dioxide layer 8 is doped with an impurity capable of providing the same type conductivity as the bulk substrate material. Since the substrate is P-type material, the dopant in layer 8 is preferably boron. However, other P+ dopants capable of forming a solid-solid reproducible diffusion source with silicon dioxide may be used in place of boron. The layer 8 is formed by a chemical deposition method and in the preferred mode of practicing this invention it is formed by oxidation of silane in the presence of diborane ($B_2H_6$) gas at a temperature of about 400° C. This reaction may be carried out in the same open chamber as the reaction resulting in formation of layer 4. The reactants preferably consist of silane (diluted to 5% by volume in nitrogen, pure oxygen and diborane (diluted to 1.0 vol. % in nitrogen). The feeding of reactants is controlled so that the deposited boron-doped glass has a depth growth rate of about 500 to about 1200Å/minute and a dopant concentration of about $5 \times 10^{22}$ atoms/cm$^3$. The deposition reaction is terminated after the borosilicate glass layer 8 has reached a thickness of about 6000 to 7000 Å. Although an undoped $SiO_2$ capping layer may be formed over the borosilicate glass layer by terminating the diborane feed several minutes before the feeding of silane and oxygen is terminated, it is not necessary to do so to prevent outgassing of the boron dopant during the subsequent diffusion step since the boron glass is hard and dense and also because the diffusion step is accomplished in the presence of a phosphine atmosphere. The boron-doped oxide in fact is capable of acting as a mask to prevent diffusion of phosphorus into the back side of the substrate. Nevertheless, the primary purpose of the boron-doped glass is to serve as a diffusion source to form a P+ layer on the bulk P-type silicon substrate.

Figure 4:
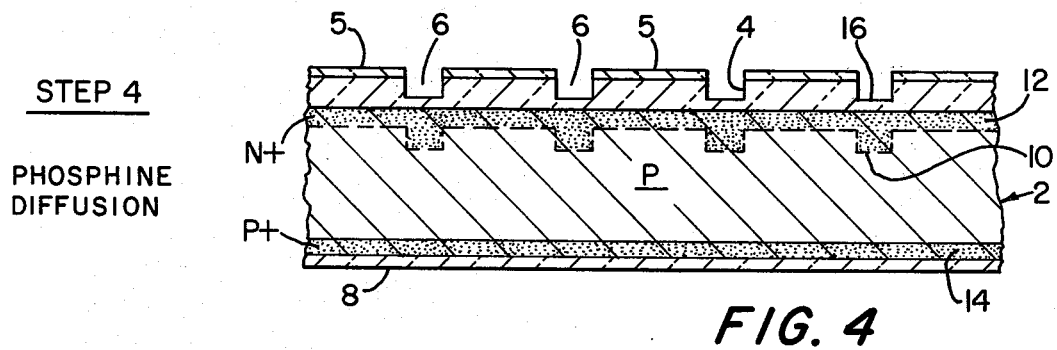

The fourth step (FIG. 4) is to subject the substrate 2 to a phosphine diffusion treatment to achieve formation of shallow and deep junction regions. This diffusion treatment involves placing the substrate in an open tube type diffusion furnace through which an atmosphere is circulated which consists of phosphine gas and oxygen in a suitable carrier gas such as argon or nitrogen. The combined gases comprise about 0.3 vol. % phosphine and 30 vol. % oxygen. The furnace is heated to a temperature of about 1050° C. and the substrate is kept exposed to the phosphine atmosphere for about 30 minutes. The purpose of the phosphine atmosphere is to provide a controlled but relatively high concentration of N-type dopant to the bare surface areas of the substrate exposed by the apertures 6 so as to achieve a relatively fast diffusing N+ region 10 of relatively high concentration phosphorus in those specific areas. Simultaneously with the relatively fast diffusion into the substrate in the apertured regions resulting from the high concentration of phosphine gas in the furnace, diffusion occurs from the doped $SiO_2$ layers on the back and front surfaces of the substrate, with N-type dopant (phosphorus) diffusing into the front surface to form N+ regions 12 connecting with the N+ regions 10 and P-type dopant (boron) diffusing into the back side of the substrate to form a high conductivity P+ region 14.

After about thirty minutes, the substrate is removed from the diffusion furnace. As a result of the diffusing process, the substrate will have (1) a front junction with junction depths of between about 0.1 and about 0.5 μm in the regions 12, with a surface concentration of phosphorus of about $3 \times 10^{21}$ atoms/cm$^3$ of silicon, and (2) a back junction with a depth of about 1.1 μm, with a surface concentration of boron about $1 \times 10^{20}$ atoms/cm$^3$. The back junction depth and boron concentration are not critical so long as they are at least about 1 μm and $5 \times 10^{18}$ atoms/cm$^3$, respectively. Attainment of these limits involves using a diffusion temperature of at least about 1000° C. or higher due to boron's finite solubility in silicon below 1000° C. The P+ back junction not only enhances the solar cell's efficiency but also facilitates better ohmic contact, as is particularly essential for contacts made of nickel and certain other metals.

It is to be noted that during the phosphine diffusion step some phosphorous-silicate glass tends to be formed over the substrate in the regions of the aperture 6 as shown at 16 due to reaction of oxygen/phosphine with the exposed silicon substrate.

Figure 5:
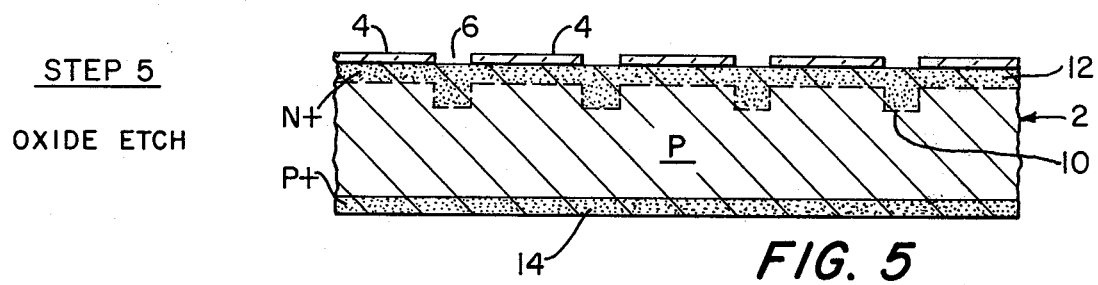

The fifth step (FIG. 5) is to selectively remove the silicon dioxide layers from the front and back of the substrate. This involves removing the silicon oxide layers from the aperture regions 6 which are to carry the metal contacts while preserving an appreciable thickness of the silicon oxide layer over the shallow diffused regions 12. The layer of silicon dioxide 16 in each aperture region 6 is relatively thin (and phosphorous rich, thus etches fast in dilute HF) while the oxide layer 8 is relatively thick. Accordingly, this fifth step is preferably two sub-steps. First the entire substrate is immersed in dilute hydrofluoric acid long enough to etch remove all of the silicon dioxide layers 16. This sub-step may remove all of the capping oxide layer 5 and some of the oxide layer 4, as well as some of the back oxide layer 8, but the reduction of the front and back oxide layers is only a minor percentage of their total thicknesses. Accordingly the second sub-step involves removing the remainder of the back oxide layer 8. This may be achieved in various ways, preferably by masking off the front side of the substrate with a spray coated etch resist and exposing the back side of the substrate to a suitable etchant, such as 10 NH$_4$F (40%): HF or 10% HF in water, long enough to remove all of the back oxide layer 8. The result is that the back side of the substrate is fully exposed while its front side is exposed in the regions of apertures 6 and covered by a silicon dioxide glass layer 4 in the areas coinciding with the shallow diffused regions 12. Another alternative approach is to first mark off the front side of the substrate with an etch resistant coating, e.g., spray coated etch resist, then etch off the boron glass layer 8, and finally remove the etch resist and etch off the silicon dioxide layers 16 and some of the combined layers 4 and 5. This procedure takes advantage of the fact that borosilicate glass etches substantially slower than undoped $SiO_2$ glass or a phosphosilicate glass. The same or different etchants may be used in both procedures as preferred.

Figure 6:
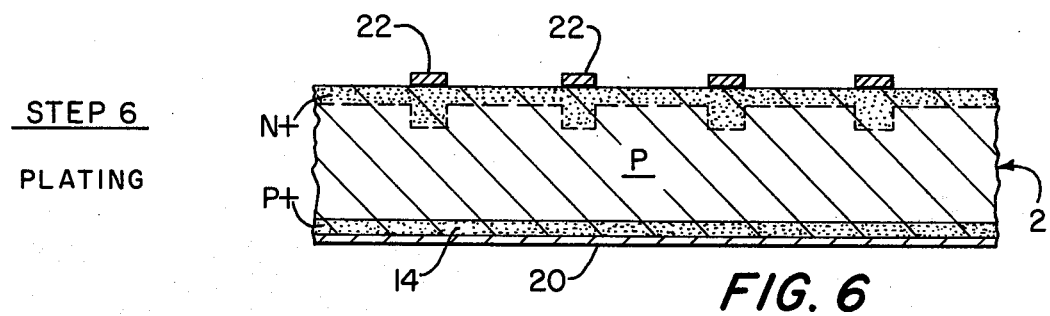

The sixth step (FIG. 6) is to suitably metallize the front and back sides of the substrate. While different metal compositions may be used for this purpose, it is preferred that metallization involve application of nickel to the substrate so as to form nickel silicides. The metallization procedure may be accomplished in various ways, notably by electroless plating or by screen printing application of metal pastes. The preferred procedure involves electroless plating of nickel and comprises the following sub-steps: (a) activating the back surface of the substrate and the areas of the front surface exposed through apertures 6 with a strike in a gold chloride/hydrofluoric acid solution, (b) transferring the substrate into a suitable electroless nickel plating solution and maintaining it there long enough to permit a layer of nickel 0.2 μm thick to be plated on its activated surface areas, whereby to form a nickel layer 20 overlyng substantially the entire back surface of the substrate and a like nickel layer 22 overlying the front surface throughout the regions of apertures 6, (c) rinsing the substrate in deionized water and drying it, (d) sintering the nickel layers in a nitrogen or hydrogen atmosphere to form nickel silicides, and (e) plating additional nickel over the nickel silicide layers to realize an adequately thick metal contact layer, e.g., sintering is carried out at temperatures of between about 300° C. to 500° C. for times ranging from about 120 minutes down to about 10 minutes according to the temperature employed. Preferably the sintering is carried out at about 300° C. for about 120 minutes. The sintering improves the adherence of the initially deposited nickel layers but also makes it more porous and thus less suitable as a contact. The extra deposited nickel layer improves the contact quality and also is more receptive to solder or other contact materials.

Figure 7:
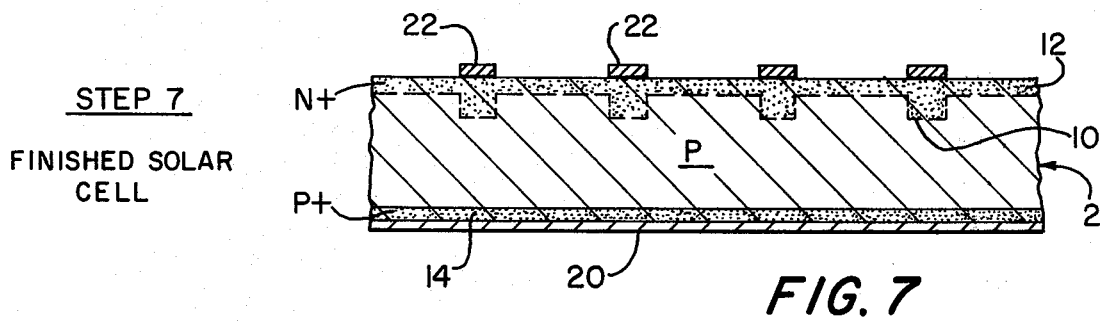
FIG. 7 is a schematic cross-sectional view of a solar cell made according to the method illustrated by FIGS. 1–6.
Figure 8:
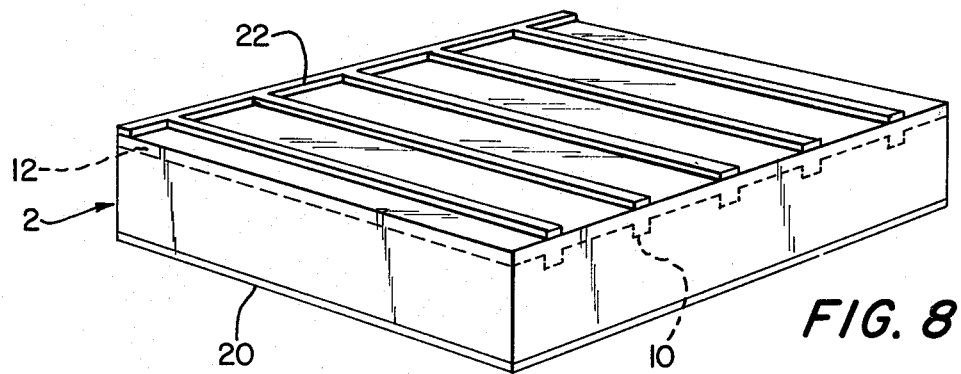
FIG. 8 is a perspective view of the solar cell of FIG. 7.

Following the nickel replating, there are choices of process directions. The preferred procedure is to etch away the remaining portions of the silicon dioxide glass layer 4 by immersing the entire substrate in a dilute (10%) hydrofluoric acid bath and then rinsing the substrate in deionized water, whereby to form a solar cell as shown in FIGS. 7 and 8 having a continuous nickel contact 20 on its rear side and a grid-like nickel contact 22 on its front side. Solder may be applied to the contacts as desired for the purpose of connecting the solar cell into a suitable circuit. An alternative procedure is to retain oxide layer 4 in the areas between the nickel layers 22 so that it can serve as an anti-reflection coating. A third possible choice is to remove the remaining portions of glass layer 4 and apply an anti-reflection coating to the front side of the substrate in the areas between nickel layer 22. This anti-reflection coating may be deposited by well-known methods, e.g., by vacuum evaporation or by chemical growth.

Obviously the above described preferred method may be modified in a number of other ways without departing from the principles of this invention. Thus, for example, it is not necessary to employ pure oxygen in making the doped glasses; instead the chemical vapor deposition reaction may be carried out with air, nitrogen oxide or carbon dioxide. Higher reaction temperatures (about 800° C. or higher) are possible using nitrogen oxide and carbon dioxide gas as the oxygen source. Air or nitrogen oxide also may be used in place of oxygen in the diffusion step. It also is recognized that the solid diffusion source may be a doped silicon nitride layer instead of a doped silicon dioxide layer. Still another possible modification is to chemically etch the layers 4 and 5 to form the apertures 6 after rather than before deposition of the borosilicate glass. However, in such case an etch resist would have to be applied to the boron-doped glass layers 8 before exposing the substrate to the etchant. Another modification is to initially form the layers 4 and/or 8 without any dopant impurity and introduce the latter to the layers by diffusion or ion-implantation. However, this latter modification increases the cost and time of the method and does not provide as good control in making composite shallow/deep junctions as described. Still another obvious modification is to use a substrate e of N-type conductivity, in which case the diffusion sources employed in forming the front and back junctions will be of a conductivity type opposite to that required in the preferred mode of practicing the invention. Another possible modification is to use dopants other than those already mentioned. Other useful dopants are antimony, bismuth, aluminum and zinc, all of which may be incorporated in a silicate glass as disclosed by U.S. Pat. No. 3,481,781, issued Dec. 2, 1969 to W. Kern. However, such other dopants are less advantageous than phosphorus, arsenic and boron in making at least moderately efficient solar cells.

The primary advantage of the invention is that solar cells having reliable ohmic contacts can be made at relatively low cost and high yield. Also the composite shallow/deep junctions may be made so that the active shallow junction is not limited by poor short wavelength response and thus can yield moderately high conversion efficiencies, while the deep junction regions make possible good ohmic contacts without junction shorting. Also the phosphorus glass layer 4 and the capping oxide layer 5 are dense and may be made sufficiently thick to resist any diffusion into it from the subsequent phosphorus diffusion atmosphere, thereby assuring good control over the relative concentrations of dopant available for diffusion into the substrate directly from the phosphosilicate glass at the same time that diffusion is occurring into the aperture regions of the substrate directly from the gaseous phosphine atmosphere in the diffusion furnace. Another significant advantage is that the glass formation can be and preferably is carried out with the substrates resting on and directly contacting a heated susceptor, so that in the case of flat or nearly flat substrates, e.g., one inch wide substantially monocrystalline silicon ribbon, the glass is deposited on only the face-up surface of the substrate and no other special measures need to be taken to prevent simultaneous deposition of glass on the opposite surface which faces the heated susceptor.

A futher advantage is that the method of forming a junction with an ohmic contact on the side closest to the junction as provided by this invention may be practiced without including the step of forming a back contact as herein described, since the latter may be provided after the front contact and junction have been formed and also may be fabricated by other techniques. Still other advantages will be obvious to persons skilled in the art.

As used herein the term "P/N junction" is to be considered the same as and interchangeable with the term "N/P junction", unless specifically indicated otherwise.

What is claimed is:

1. A method of making a photovoltaic semiconductor solar cell comprising the steps of:
   (1) providing a semiconductor body of a first conductivity type and having first and second opposite surfaces;
   (2) forming on said first surface a continuous layer of a material containing a dopant capable upon diffusion into said body of forming a region of a second opposite conductivity type in said body;
   (3) removing said layer from selected portions of said surface so as to form a grid-like pattern of apertures defined by intervening non-removed sections of said layer;
   (4) heating said body in an atmosphere containing said dopant at a temperature at which said dopant will diffuse into said body from said layer and said atmosphere so as to form in said body relatively deep diffused regions of opposite conductivity type in line with said apertures and relatively shallow diffused regions of said opposite conductivity type in line with said intervening layer sections, said regions establishing a junction within said body; and (5) forming conductive contacts on said surfaces with the contacts on said first surface conforming to and overlying said deep diffused regions.

2. Method according to claim 1 wherein said semiconductor body is P-type conductivity silicon and said diffused dopant regions are N-type conductivity.

3. Method according to claim 2 wherein said dopant is phosphorus, arsenic or antimony.

4. Method according to claim 3 wherein said dopant is phosphorus.

5. Method of making a solar cell comprising the steps of:
(a) providing a substrate in the form of a semiconductor body of a first type conductivity;
(b) depositing on one surface of said body a diffusion source in the form of a film doped with a diffusion impurity of a second conductivity type;
(c) removing said film from only selected areas of said surface so as to form a pattern of apertures defined by intervening sections of said film;
(d) diffusing said second conductivity type impurity out of said film and through said surface into said body and also diffusing additional second conductivity type impurity into said body via the apertures in said film so as to form a diffused second conductivity type region in said body which is separated from the first conductivity type bulk region of said body by a P/N junction and which has a greater depth measured from said surface along the areas of said apertures than along the areas of said intervening sections; and
(e) forming a metal contact on said one surface only in the areas thereof coincident with said apertures.

6. Method of claim 5 further including the step of removing said intervening sections of said film from said surface after said conductivity type region has been formed.

7. Method of claim 6 wherein said intervening sections of film are removed after the metal contact has been formed.

8. Method of claim 5 wherein said body has a second surface forming a boundary of said first conductivity type bulk region, and further including the step of introducing a first conductivity type impurity to said conductivity type bulk region so as to form a region of relatively high first type conductivity adjacent to said second surface, and thereafter forming a metal contact on said second surface.

9. Method of claim 8 wherein said region of relatively high first type conductivity is formed by diffusing said first conductivity type impurity through said second surface into said body from a second film overlying said second surface.

10. Method of claim 5 wherein said substrate is semiconductor silicon.

11. Method of claim 10 wherein said substrate is P-type silicon.

12. Method of claim 11 wherein said second conductivity type impurity is phosphorus or arsenic.

13. Method of claim 5 wherein said film is vitreous $SiO_2$.

14. Method of claim 5 wherein said diffusion source is a silicate glass containing phosphorus or arsenic.

15. Method of claim 5 wherein said apertures are formed by etch removal of said film.

16. Method of claim 15 wherein said diffusion source is a silicate glass film containing phosphorus, arsenic or antimony.

17. Method of claim 5 wherein said semiconductor body is silicon and further wherein said diffusion source is a silicate glass film containing phosphorus, arsenic or boron and is formed by contacting said surface under heating with a vaporous mixture of silane, oxygen, and a hydride of phosphorus, arsenic or boron, said heating being to a temperature such that said silane and hydride are oxidized and interact to form a glass film which is deposited on said surface and contains atoms of said phosphorus or arsenic.

18. Method of claim 17 wherein formation of said second conductivity type region involves heating said glass film to a temperature high enough to cause said atoms of phosphorus or arsenic to diffuse through said glass into said semiconductor body.

19. Method of claim 18 wherein said body is disposed in an atmosphere containing atoms of phosphorus or arsenic while it is being heated to effect formation of said second conductivity type region, whereby phosphorus or arsenic atoms from said atmosphere will diffuse into said body via said apertures to form the greater depth portions of said second conductivity type region.

* * * * *